United States Patent
Dube et al.

(10) Patent No.: US 12,297,559 B2
(45) Date of Patent: May 13, 2025

(54) METHOD AND APPARATUS FOR LOW TEMPERATURE SELECTIVE EPITAXY IN A DEEP TRENCH

(71) Applicant: Applied Materials, Inc., Santa Clara, CA (US)

(72) Inventors: Abhishek Dube, Fremont, CA (US); Xuebin Li, Sunnyvale, CA (US); Hua Chung, San Jose, CA (US); Flora Fong-Song Chang, Saratoga, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 407 days.

(21) Appl. No.: 17/961,463

(22) Filed: Oct. 6, 2022

(65) Prior Publication Data

US 2023/0036426 A1    Feb. 2, 2023

Related U.S. Application Data

(63) Continuation of application No. 15/889,669, filed on Feb. 6, 2018, now abandoned.
(Continued)

(51) Int. Cl.
*C30B 25/18* (2006.01)
*C23C 16/02* (2006.01)
(Continued)

(52) U.S. Cl.
CPC ........ *C30B 25/186* (2013.01); *C23C 16/0218* (2013.01); *C23C 16/0236* (2013.01);
(Continued)

(58) Field of Classification Search
CPC ....... C30B 25/186; C30B 29/06; C30B 33/12; C23C 16/0218; C23C 16/0236;
(Continued)

(56) References Cited

U.S. PATENT DOCUMENTS 6,494,986 B1   12/2002   Hanawa et al.
6,893,907 B2    5/2005   Maydan et al.
(Continued)

FOREIGN PATENT DOCUMENTS

JP   2001511608       8/2001
JP   2001511608 A     8/2001
(Continued)

OTHER PUBLICATIONS

International Search Report and Written Opinion dated Jun. 27, 2018 for Application No. PCT/US2018/017016.
(Continued)

*Primary Examiner* — Duy Vu N Deo
(74) *Attorney, Agent, or Firm* — Patterson + Sheridan, LLP

(57) ABSTRACT

Embodiments of the present disclosure generally relate to methods for forming epitaxial layers on a semiconductor device. In one or more embodiments, methods include removing oxides from a substrate surface during a cleaning process, flowing a processing reagent containing a silicon source and exposing the substrate to the processing reagent during an epitaxy process, and stopping the flow of the processing reagent. The method also includes flowing a purging gas and pumping residues from the processing system, stopping the flow of the purge gas, flowing an etching gas and exposing the substrate to the etching gas. The etching gas contains hydrogen chloride and at least one germanium and/or chlorine compound. The method further includes stopping the flow of the at least one compound while continuing the flow of the hydrogen chloride and exposing the substrate to the hydrogen chloride and stopping the flow of the hydrogen chloride.

22 Claims, 7 Drawing Sheets

Related U.S. Application Data

(60) Provisional application No. 62/457,572, filed on Feb. 10, 2017.

(51) Int. Cl.

| | | |
|---|---|---|
| *C23C 16/24* | (2006.01) | |
| *C23C 16/54* | (2006.01) | |
| *C23C 16/56* | (2006.01) | |
| *C30B 29/06* | (2006.01) | |
| *C30B 33/12* | (2006.01) | |
| *H01J 37/32* | (2006.01) | |
| *H01L 21/02* | (2006.01) | |
| *H01L 21/3065* | (2006.01) | |
| *H01L 21/67* | (2006.01) | |
| *H01L 21/687* | (2006.01) | |

(52) U.S. Cl.
CPC .......... *C23C 16/0245* (2013.01); *C23C 16/24* (2013.01); *C23C 16/54* (2013.01); *C23C 16/56* (2013.01); *C30B 29/06* (2013.01); *C30B 33/12* (2013.01); *H01J 37/32091* (2013.01); *H01J 37/321* (2013.01); *H01J 37/32357* (2013.01); *H01J 37/32862* (2013.01); *H01J 37/32899* (2013.01); *H01L 21/02532* (2013.01); *H01L 21/0257* (2013.01); *H01L 21/02576* (2013.01); *H01L 21/0262* (2013.01); *H01L 21/02661* (2013.01); *H01L 21/3065* (2013.01); *H01L 21/67115* (2013.01); *H01L 21/6719* (2013.01); *H01L 21/67207* (2013.01); *H01L 21/68742* (2013.01)

(58) Field of Classification Search
CPC ..... C23C 16/0245; C23C 16/24; C23C 16/54; C23C 16/56; H01J 37/32091; H01J 37/321; H01J 37/32357; H01J 37/32862; H01J 37/32899; H01L 21/02532; H01L 21/0257; H01L 21/02576; H01L 21/0262; H01L 21/02661; H01L 21/3065; H01L 21/67115; H01L 21/6719; H01L 21/67207; H01L 21/68742; H01L 21/67098; H01L 21/8238; H01L 21/67028; H01L 21/67196
USPC ......................................................... 216/67
See application file for complete search history.

(56) References Cited

U.S. PATENT DOCUMENTS

| | | | |
|---|---|---|---|
| 6,908,865 B2 | 6/2005 | Kranz et al. | |
| 6,939,434 B2 | 9/2005 | Collins et al. | |
| 7,223,676 B2 | 5/2007 | Hanawa et al. | |
| 7,288,491 B2 | 10/2007 | Collins et al. | |
| 7,479,456 B2 | 1/2009 | Buchberger, Jr. et al. | |
| 7,700,465 B2 | 4/2010 | Collins et al. | |
| 8,008,166 B2 | 8/2011 | Sanchez et al. | |
| 8,080,466 B2 | 12/2011 | Su et al. | |
| 8,309,440 B2 | 11/2012 | Sanchez et al. | |
| 9,683,308 B2 | 6/2017 | Olsen et al. | |
| 2002/0098713 A1 | 7/2002 | Henley et al. | |
| 2003/0062333 A1 | 4/2003 | Kranz et al. | |
| 2005/0191827 A1 | 9/2005 | Collins et al. | |
| 2005/0224181 A1 | 10/2005 | Merry et al. | |
| 2006/0105114 A1 | 5/2006 | White | |
| 2007/0240631 A1 | 10/2007 | Nijhawan et al. | |
| 2008/0308409 A1 | 12/2008 | Brcka | |
| 2009/0079034 A1 | 3/2009 | Wang | |
| 2009/0085065 A1 | 4/2009 | Mishra et al. | |
| 2009/0194026 A1 | 8/2009 | Burrows et al. | |
| 2010/0216308 A1 | 8/2010 | Verdonck et al. | |
| 2010/0261340 A1 | 10/2010 | Nijhawan et al. | |
| 2011/0027973 A1 | 2/2011 | Su et al. | |
| 2011/0033966 A1 | 2/2011 | Su et al. | |
| 2011/0042682 A1 | 2/2011 | Preble et al. | |
| 2011/0124169 A1* | 5/2011 | Ye | H01L 21/02532 257/E21.431 |
| 2012/0024223 A1* | 2/2012 | Torres, Jr. | H01L 21/02529 118/728 |
| 2013/0068390 A1 | 3/2013 | Sanchez et al. | |
| 2014/0070377 A1* | 3/2014 | Yu | H01L 29/66636 117/89 |
| 2014/0174357 A1 | 6/2014 | Kim et al. | |
| 2014/0273379 A1* | 9/2014 | Tsai | H01L 21/02664 438/283 |
| 2015/0040822 A1 | 2/2015 | Olsen et al. | |
| 2016/0222504 A1 | 8/2016 | Haukka et al. | |
| 2017/0221709 A1* | 8/2017 | Ueno | H01L 29/66772 |

FOREIGN PATENT DOCUMENTS

| | | |
|---|---|---|
| KR | 10-2007-0007915 | 1/2007 |
| KR | 10-2007-0007915 A | 1/2007 |
| KR | 10-2015-0056639 A | 5/2015 |
| TW | 200802543 | 1/2008 |
| TW | 200802543 A | 1/2008 |
| TW | 201332044 A | 8/2013 |
| TW | 201539667 | 10/2015 |
| TW | 201539667 A | 10/2015 |
| WO | 03056603 | 7/2003 |
| WO | 03056603 A2 | 7/2003 |

OTHER PUBLICATIONS

Taiwan Office Action dated Aug. 17, 2021 for Application No. 107104261.
Korean Office Action dated Aug. 1, 2022 for Application No. 10-2019-7026383.
Taiwan Office Action dated Jul. 4, 2024 for Application No. 113103248.
Korean Office Action dated Jun. 3, 2024 for Application No. 10-2024-7014647.
Chinese Office Action dated Jan. 20, 2023 for Application No. 201880010056.1.
Taiwan Office Action dated Jan. 31, 2023 for Application No. 107104261.
Korean Office Action dated Mar. 28, 2023 for Application No. 10-2019-7026383.
Taiwan Office Action dated Nov. 4, 2024 for Application No. 113103248.
Taiwan Office Action dated Nov. 8, 2023 for Application No. 112115071.

* cited by examiner

METHOD AND APPARATUS FOR LOW TEMPERATURE SELECTIVE EPITAXY IN A DEEP TRENCH

CROSS-REFERENCE TO RELATED APPLICATIONS

This application is a continuation application of U.S. application Ser. No. 15/889,669, filed Feb. 6, 2018, which claims benefits of U.S. Prov. Appl. No. 62/457,572, filed Feb. 10, 2017, which are incorporated herein by reference.

FIELD

Implementations of the disclosure generally relate to the field of semiconductor manufacturing processes, more particularly, to a cluster tool and methods of depositing silicon-containing films for forming semiconductor devices.

BACKGROUND

Low temperature epitaxy has a distinct advantage of yielding epitaxial films with very high degree of dopant activation. Epitaxial films with high dopant activation can be useful for contact applications in the CMOS manufacturing process where thermal budget needs to be at or below certain temperature, such as 450° C., in order to preserve the high-K metal gate stack in the middle-of-line (MOL) fabrication process.

There is a need in the art to integrate low temperature epitaxy for growing phosphorous-containing silicon layer in order to enable orders of magnitude reduction in contact resistance of nMOS transistors.

SUMMARY

The present disclosure generally relate to a cluster tool and methods for forming an epitaxial layer on a semiconductor device. In one implementation, the cluster tool includes a transfer chamber, a pre-clean chamber coupled to the transfer chamber, a plasma-cleaning chamber coupled to the transfer chamber, a deposition chamber coupled to the transfer chamber, an etch chamber coupled to the transfer chamber, and a thermal process chamber coupled to the transfer chamber.

In another implementation, the cluster tool includes a transfer chamber coupled to a load-lock chamber, a first cleaning chamber coupled to the transfer chamber, the first cleaning chamber comprising a capacitively coupled plasma source and a substrate support coupling to a bias RF power supply, a second cleaning chamber coupled to the transfer chamber, the second cleaning chamber comprising an inductively coupled plasma source, an epitaxial deposition chamber coupled to the transfer chamber, the epitaxy chamber comprising a liquid vaporizer in fluid communication with a liquid precursor source, an etch chamber coupled to the transfer chamber, and a thermal process chamber coupled to the transfer chamber.

BRIEF DESCRIPTION OF THE DRAWINGS

Implementations of the present disclosure, briefly summarized above and discussed in greater detail below, can be understood by reference to the illustrative implementations of the disclosure depicted in the appended drawings. It is to be noted, however, that the appended drawings illustrate only typical implementations of this disclosure and are therefore not to be considered limiting of its scope, for the disclosure may admit to other equally effective implementations.

Figure 1:
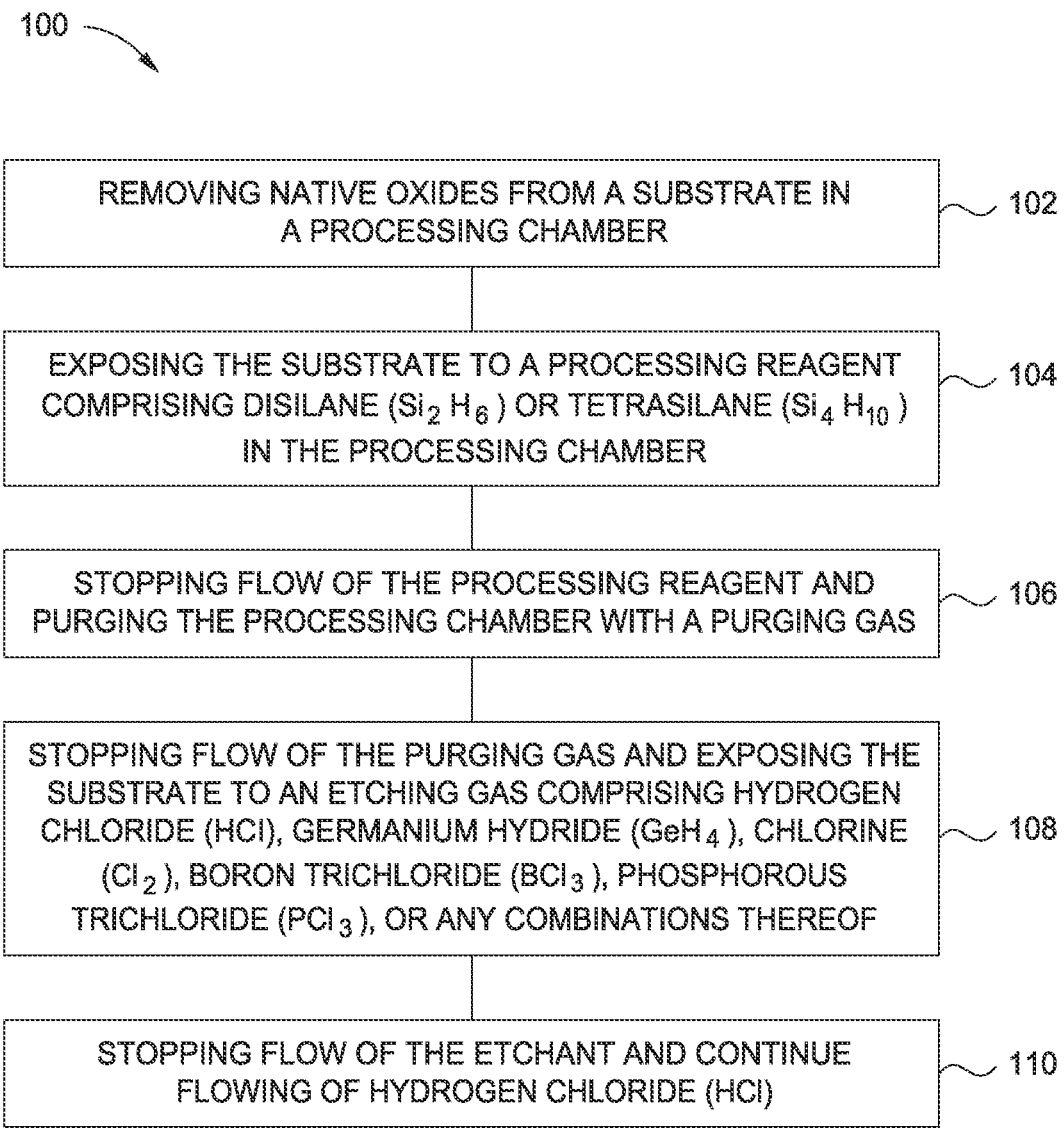
FIG. 1 is a flow chart illustrating a method of forming an epitaxial layer according to one implementation of the present disclosure.

To facilitate understanding, identical reference numerals have been used, where possible, to designate identical elements that are common to the figures. The figures are not drawn to scale and may be simplified for clarity. It is contemplated that elements and features of one implementation may be beneficially incorporated in other implementations without further recitation.

DETAILED DESCRIPTION

FIG. 1 is a flow chart 100 illustrating a method of forming an epitaxial layer according to one implementation of the present disclosure. The method begins at block 102 where a substrate is pre-cleaned. The substrate may be a wafer or any object having native oxides. The substrate may contain monocrystalline surfaces and/or one secondary surface that is non-monocrystalline, such as polycrystalline or amorphous surfaces. Monocrystalline surfaces may include the bare crystalline substrate or a deposited single crystal layer usually made from a material such as silicon, germanium, silicon germanium or silicon carbon. Polycrystalline or amorphous surfaces may include dielectric materials, such as oxides or nitrides, specifically silicon oxide or silicon nitride, as well as amorphous silicon surfaces.

Figure 2:
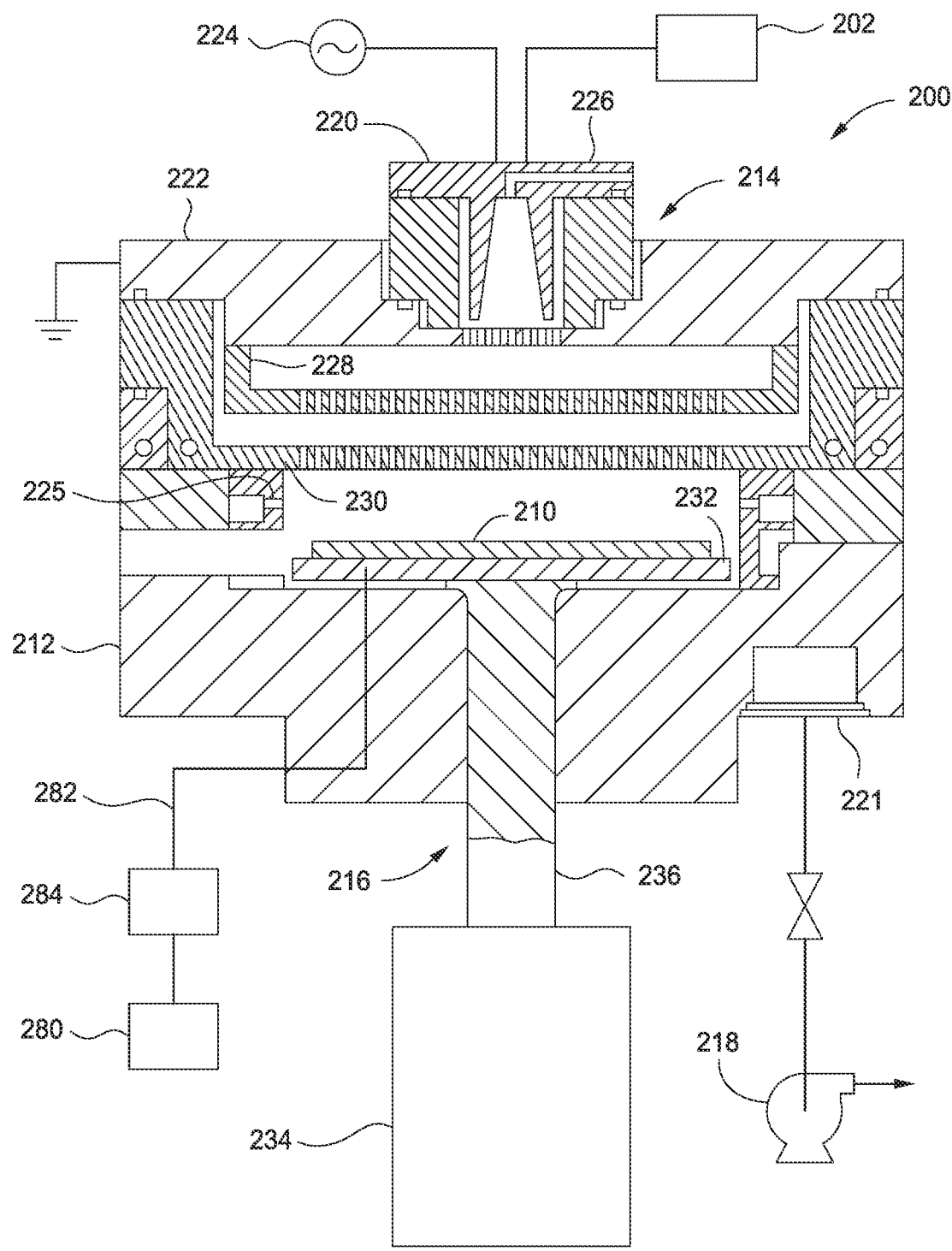
FIG. 2 is a cross-sectional view of a processing chamber that may be used to perform a cleaning process found in FIG. 1.

Any suitable cleaning process that removes oxides from the substrate without significantly damaging the substrate may be used. Suitable cleaning processes include sputter etch processes, plasma-based oxide etch processes, wet etch processes, or combinations thereof. Exemplary plasma-based oxide etch processes include $NF_3/NH_3$ inductively coupled plasma processes or $NF_3/NH_3$ capacitively coupled plasma processes. In one implementation, the plasma-based oxide etch process is a remote plasma assisted dry etch process which involves the simultaneous exposure of a substrate to $NF_3$ and $NH_3$ plasma by-products. In one example, the plasma-based oxide etch process may be similar to or may include a SICONI® etch process that is available from Applied Materials, Inc. of Santa Clara, Calif. The SICONI® etch process may be performed in a SICONI® Preclean chamber, available from Applied Materials, Inc. of Santa Clara, California. One exemplary SICONI® Preclean chamber is shown in FIG. 2 and will be discussed below.

In some implementations that use remote plasma, excitation of the gas species allows plasma-damage-free substrate processing. The remote plasma etch can be largely conformal and selective towards silicon oxide layers, and thus does not readily etch silicon regardless of whether the silicon is amorphous, crystalline or polycrystalline. The remote plasma process will generally produce solid by-products which grow on the surface of the substrate as substrate material is removed. The solid by-products can be subsequently removed via sublimation when the temperature of the substrate is raised (e.g., 300° C.). The plasma etch process results in a substrate surface having silicon-hydrogen (Si—H) bonds thereon.

Figure 3:
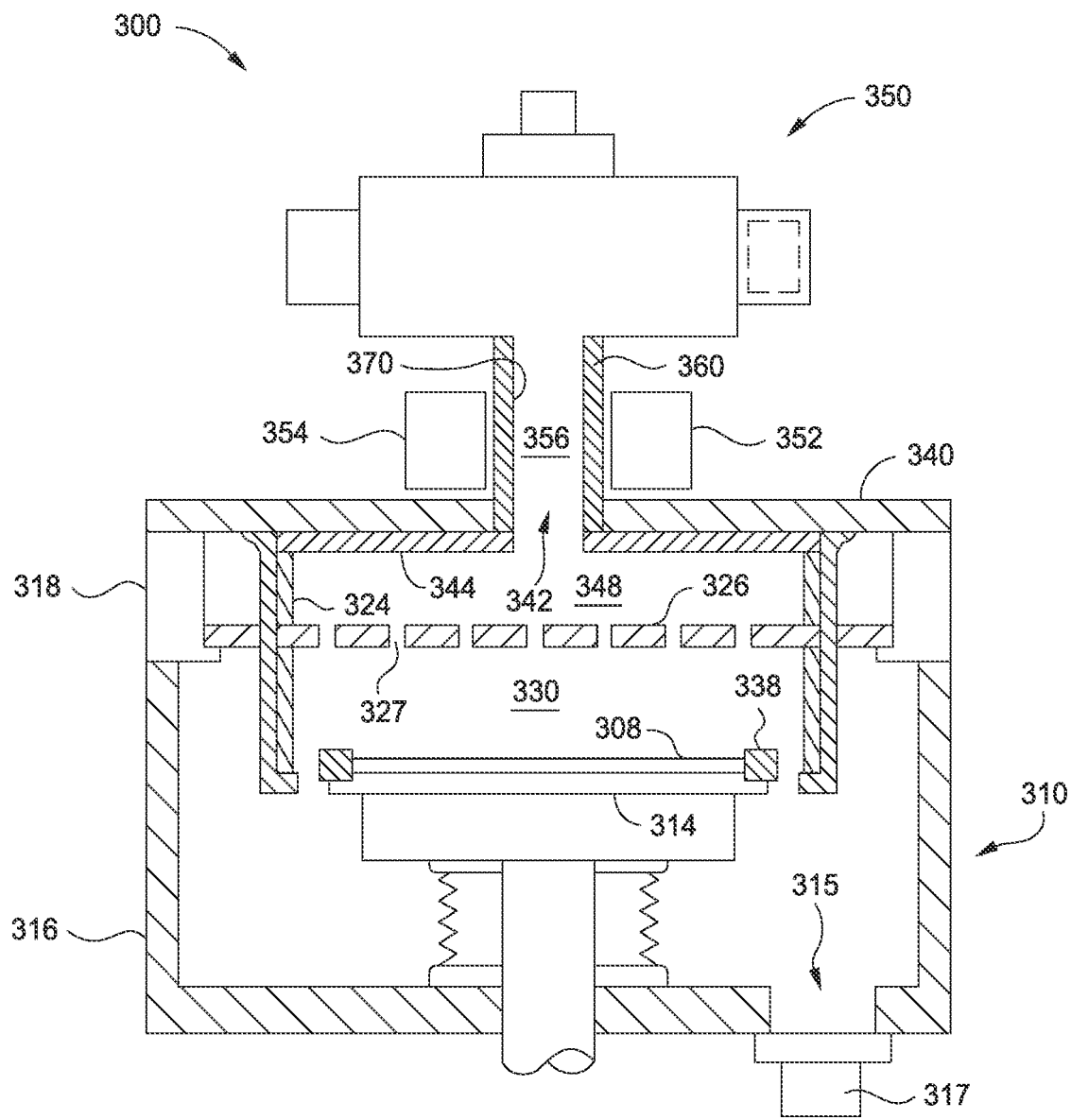
FIG. 3 is a cross-sectional view of a plasma-cleaning chamber that may be used to perform a cleaning process found in FIG. 1.

In some implementations, the cleaning process may be performed in a processing chamber using a remote plasma source. For example, the processing chamber may be an AKTIV® Pre-Clean chamber, available from Applied Materials, Inc. of Santa Clara, California. One exemplary etch chamber using ICP source is shown in FIG. 3 and will be discussed below.

Figure 5:
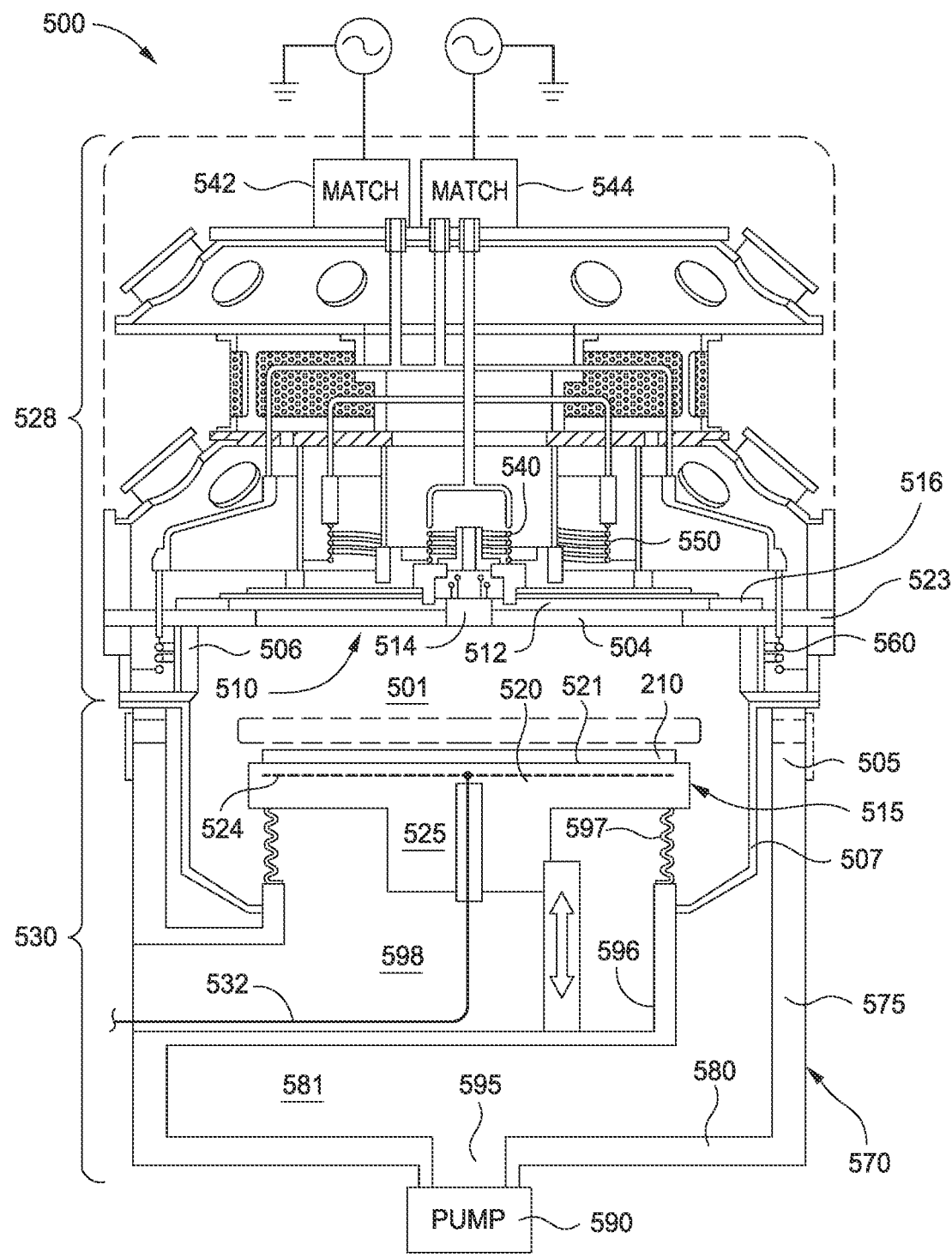
FIG. 5 is a cross-sectional view of an ICP plasma chamber that may be used to perform etch processes found in FIG. 1.

In some implementations, the cleaning process may be performed in an etch chamber using an inductively coupled plasma (ICP) source. For example, the etch chamber may be a Centura® Advantedge™ Mesa™ etch chamber, available from Applied Materials, Inc. of Santa Clara, California. Alternatively, the cleaning process may be performed in an etch chamber employing a radical-based chemistry. One exemplary etch chamber using ICP source is shown in FIG. 5 below.

If desired, the block 102 may include additional preparation steps. For example, the block 102 may include pre-baking the substrate to further clean the surface. The pre-bake may be performed in the presence of hydrogen at a temperature of about 330° C. In such a case, the pre-bake may be done in an epitaxy chamber, such as one shown in FIG. 4 below. The pre-bake may include raising the temperature of the substrate to about 330° C. In some implementations, the block 102 includes an HF clean of the substrate, which may result in —H terminations on the silicon (monocrystalline) surfaces and —OH termination on the oxide (dielectric) surfaces.

At block 104, the substrate is exposed to a processing reagent in, for example, a gas phase epitaxy chamber at a target temperature for epitaxial deposition of a silicon-containing layer. An exemplary epitaxy chamber that may be used is a Centura® RP EPI chamber, available from Applied Materials, Inc., of Santa Clara, California. One exemplary epitaxy chamber is shown below in FIG. 4. It is contemplated that other chambers, including those available from other manufacturers, may be used to practice epitaxial deposition.

The target temperature for epitaxial deposition may be between about 250° C. and about 600° C., such as about 300° C. to about 500° C., for example about 350° C. to about 400° C. The pressure within the epitaxy chamber is kept relatively low, for example less than about 50 Torr, such as about 10 Torr to about 40 Torr. The processing reagent may include one or more deposition gases and at least one dopant gas. The deposition gas may include one or more precursor gases selected from Group III precursor gas, Group V precursor gas, Group VI precursor gas, or Group IV precursor gas. In cases where a silicon-containing epitaxial layer is formed, the deposition gas may contain at least a silicon source. Exemplary silicon sources may include, but are not limited to, silanes, halogenated silanes, silicon tetrachloride ($SiCl_4$), or any combinations thereof. Silanes may include silane ($SiH_4$) and higher silanes with the empirical formula $Si_xH_{(2x+2)}$, such as disilane ($Si_2H_6$), trisilane ($Si_3H_8$), tetrasilane ($Si_4H_{10}$), pentasilane ($Si_5H_{12}$), or hexasilane ($Si_6H_{14}$). Other higher silanes, such as a silicon hydride expressed as $Si_nH_{2n}$ (n is a natural number equal to or greater than 3), may also be used. For example, cyclotrisilane ($Si_3H_6$), cyclotetrasilane ($Si_4H_8$), cyclopentasilane ($Si_6H_{10}$), cyclohexasilane ($Si_6H_{12}$), or cycloheptasilane ($Si_7H_{14}$). Halogenated silanes may include monochlorosilane (MCS), dichlorosilane (DCS), trichlorosilane (TCS), hexachlorodisilane (HCDS), octachlorotrisilane (OCTS), silicon tetrachloride (STC), or a combination thereof. In some implementations, silanes may include higher order silanes with varying degrees of halogenation in the form of —F, Cl, Br or I attached to them in order to enable selectivity. For example, $Si_2H_4Cl_2$ or $Si_3H_5Cl_3$ etc.

In one exemplary implementation, the silicon source comprises tetrasilane. In another exemplary implementation, the silicon source comprises disilane. In yet another exemplary implementation, the silicon source comprises tetrasilane and disilane.

The dopant gas may include, but is not limited to phosphorous, boron, arsenic, gallium, or aluminum, depending on the desired conductive characteristic of the deposited epitaxial layer. The deposition gas may optionally contain at least one secondary elemental source, such as a germanium source or a carbon source. Depending on application, other elements, such as metals, halogens or hydrogen may be incorporated within a silicon-containing layer. In one exemplary implementation, the silicon-containing epitaxial layer is phosphorous doped silicon (Si:P), which can be achieved using a dopant such as phosphine ($PH_3$), phosphorus trichloride ($PCl_3$), phosphorous tribromide ($PBr_3$), and phosphates such as tributyl phosphate (TBP).

The processing reagents may optionally include a carrier gas. The carrier gas may be selected based on the precursor(s) used and/or the process temperature during the epitaxial process. Suitable carrier gases include nitrogen, hydrogen, argon, helium, or other gases which are inert with respect to the epitaxial process. Nitrogen may be utilized as a carrier gas in implementations featuring low temperature (e.g., <600° C.) processes. The carrier gas may have a flow rate from about 1 SLM (standard liters per minute) to about 100 SLM, such as from about 3 SLM to about 30 SLM.

Table 1 below illustrates selective growth rate of a phosphorous-containing epitaxial layer (Si:P) formed using different silicon sources (tetrasilane vs disilane) under given process conditions. In all examples shown in Table 1, tetrasilane was provided at a flow rate of about 11 sccm, and disilane was provided at a flow rate of about 90 sccm. Phosphine was provided at a flow rate of about 1000 sccm (tetrasilane) and about 300 sccm (disilane). Hydrogen (not shown), which serves as a carrier gas, was provided at a flow rate of about 8000 sccm. In all examples, the processing chamber was heated and maintained at about 400° C. to about 500° C., with a chamber pressure of about 40 Torr. The process conditions described herein and throughout this disclosure are based on a 300 mm diameter substrate. As can be seen in Table 1 below, the silicon source using tetrasilane at 500° C. provides a superior growth rate than the silicon source using disilane, even though tetrasilane is flowed at a much less amount than disilane.

TABLE 1

| Silicon Source | Condition | Flows/Time | Thickness/Strain %-XRD | Growth Rate |
| --- | --- | --- | --- | --- |
| Tetrasilane ($Si_4H_{10}$) | 400° C./40T | $Si_4H_{10}$: 11 sccm/PH3: 1000 sccm/Time: 3000 s | 270 Å/1.4% | 5 Å/min |
| Tetrasilane ($Si_4H_{10}$) | 450° C./40T | $Si_4H_{10}$: 11 sccm/PH3: 1000 sccm/Time: 712 s | 450 Å/1.3% | 37 Å/min |
| Tetrasilane ($Si_4H_{10}$) | 500° C./40T | $Si_4H_{10}$: 11 sccm/PH3: 1000 sccm/Time: 200 s | 796 Å/1.3% | 239 Å/min |
| Disilane ($Si_2H_6$) | 450° C./40T | $Si_2H_6$: 90 sccm/PH3: 300 sccm/Time: 1800 s | 265 Å/1.4% | 9 Å/min |
| Disilane ($Si_2H_6$) | 475° C./40T | $Si_2H_6$: 90 sccm/PH3: 300 sccm/Time: 1800 s | 540 Å/1.1% | 18 Å/min |
| Disilane ($Si_2H_6$) | 500° C./40T | $Si_2H_6$: 90 sccm/PH3: 300 sccm/Time: 200 s | 550 Å/1.0% | 165 Å/min |

In some implementations where disilane is used as a silicon source, the processing reagent may further include a halogen precursor. Exemplary halogen precursors may be those containing halogen molecules, such as chlorine gas or hydrogen chloride. The halogen precursor may be flowed simultaneously or concurrently with the deposition gas (i.e., co-flow mode) during the epitaxial process. In such a case, the deposition gas and the halogen precursor may be separately flowed into the epitaxy chamber. The deposition gas and the halogen precursor may be pre-mixed and formed as a gas mixture before flowing into the epitaxy chamber. In either case, the flow ratio of the deposition gas and the halogen precursor in the epitaxy chamber may be about 1:1.5 to about 1:3, for example about 1:2. It is contemplated that disilane and chlorine gas mentioned herein can be replaced with any other silicon source and halogen precursor using the flow ratio described herein.

At block 106, once a desired thickness of the silicon-containing epitaxial layer has been formed on the substrate, the flow of the processing reagent is discontinued and any reaction residues and/or unwanted gases are pumped out of the epitaxy chamber. During block 106, the pressure within the epitaxy chamber is maintained at about 1 Torr to about 30 Torr, such as about 1.5 Torr to about 15 Torr. A purging gas, such as hydrogen or argon, may be introduced into the epitaxy chamber to allow processing reagent and residues to be pumped from the epitaxy chamber while maintaining the epitaxy chamber at a required chamber pressure. The purging time may vary between about 5 seconds to about 45 seconds, for example about 15 seconds to about 20 seconds.

At block 108, the flow of the purging gas is discontinued and the substrate is exposed to an etching gas to selectively remove amorphous material, for example amorphous silicon (a-Si), from dielectric surfaces of the substrate. The etching process may be performed in an etching chamber, such as one shown in FIG. 3 or FIG. 5.

The etching gas may include at least one etchant and a carrier gas. The etchant may be a halogen-containing etchant. Exemplary etchant may include, but is not limited to hydrogen chloride (HCl), germanium hydride ($GeH_4$), chlorine ($Cl_2$), boron trichloride ($BCl_3$), phosphorus trichloride ($PCl_3$), or any combinations thereof. Higher order germanes such as digermane ($Ge_2H_6$) or trigermane ($Ge_3H_8$), or chlorinated germane gas such as germanium tetrachloride ($GeCl_4$), dichlorogermane ($GeH_2Cl_2$), trichlorogermane ($GeHCl_3$), hexachlorodigermane ($Ge_2Cl_6$), or a combination of any two or more thereof, may also be used. In one implementation, the etchant includes HCl and $GeH_4$. In another implementation, the etchant includes HCl and $PCl_3$. In yet another implementation, the etchant includes $Cl_2$ and $PCl_3$. In yet one another implementation, the etchant includes HCl, $GeH_4$ and $PCl_3$. Any suitable halogenated germanium compounds may also be used.

The carrier gas may include hydrogen, nitrogen, argon, helium, and any combinations thereof. A carrier gas may be selected based upon specific etchant(s). In one exemplary implementation, the etchant includes HCl and $GeH_4$. In another implementation, the etchant includes $Cl_2$ and $GeH_4$. In cases where HCl and $GeH_4$ are used during etching, the flow of HCl and $GeH_4$ may be introduced into the epitaxy chamber at a $GeH_4$/HCl ratio of about 1:3 to about 1:7, for example about 1:5. In one exemplary example, $GeH_4$ is introduced at a flow rate of about 60 sccm and HCl is introduced at 300 sccm, with the carrier gas ($N_2$) introduced at a flow rate of about 3 SLM.

The etching time may be about 250 seconds to about 850 seconds, for example about 300 seconds to about 800 seconds, for example about 360 seconds to about 480 seconds. During the etch-back, the etching temperature may be about 600° C. or less, for example 500° C. or less, such as about 200° C. to about 400° C. The chamber pressure during etching may be maintained at about 80 Torr to about 300 Torr, such as about 100 Torr to about 200 Torr. The etch-back process may be performed in the epitaxy chamber. It has been observed that the process conditions described herein can minimize epitaxial layer etch while removing all the amorphous silicon growth on dielectric surfaces. Particularly, the addition of $GeH_4$ or higher order germanes to HCl provide sufficient etching with desired selectivity at lower temperatures of 500° C. or less, which has been a challenging in the past if HCl alone was used for etching.

Depending on the epitaxial thickness, it has been observed that an amorphous silicon/crystalline epitaxial layer etch selectivity of 30:1 or greater, such as 50:1 or even 80:1 can be achieved at low etching temperatures using the etchants discussed herein. Thus, the result is a much thinner amorphous silicon layer on the dielectric surface compared to the epitaxial layer on the semiconductor surface due to the etch-back process performed after the epitaxial deposition.

At block 110, the flow of the etchant, such as $GeH_4$, may be discontinued and HCl may continue to flow to remove $GeH_4$ and other reaction residues/byproducts from the substrate. The flow of HCl may be continued for about 5 seconds to about 20 seconds, for example about 10 seconds.

Figure 6:
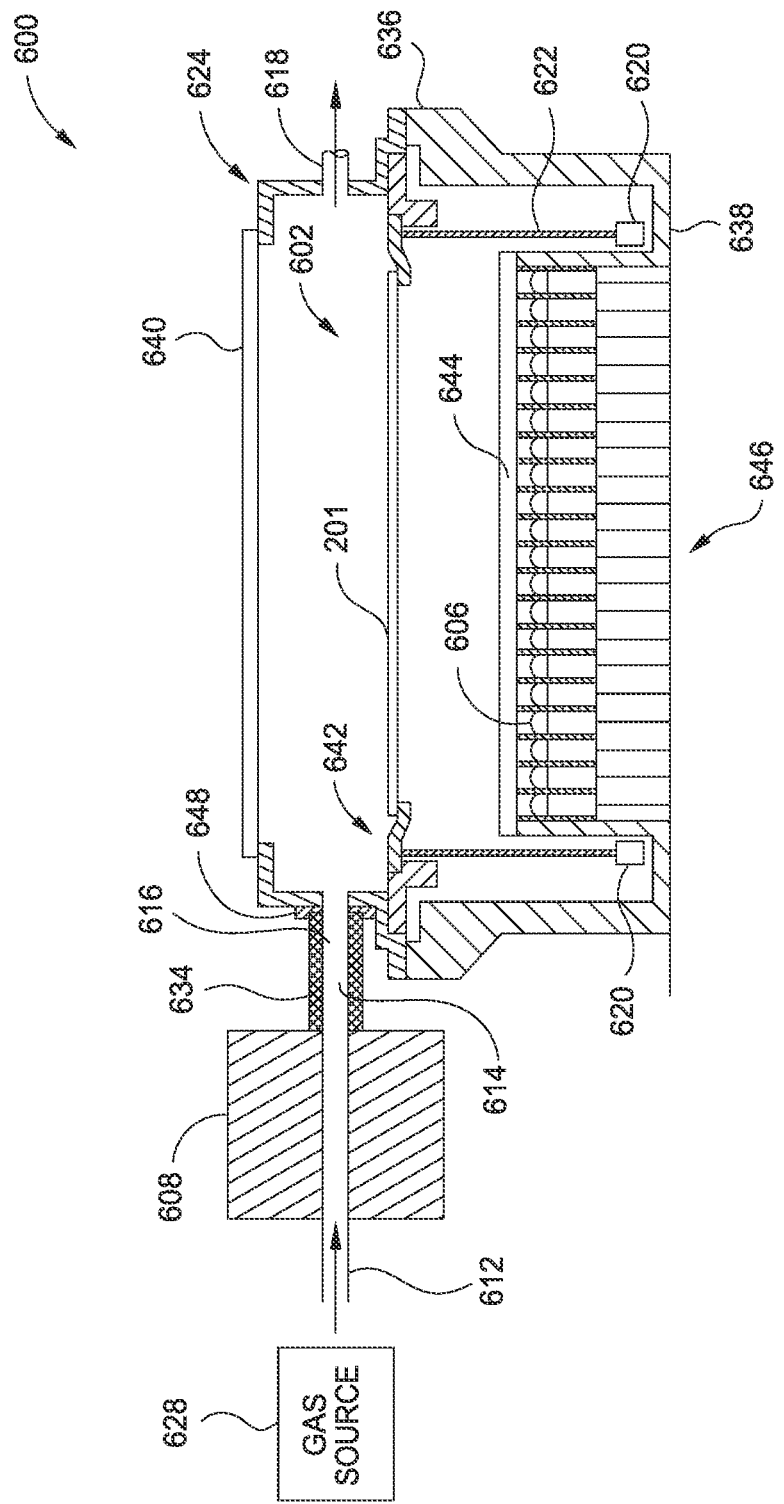
FIG. 6 is a schematic, cross-sectional view of a processing system that may be used for temperature-controlled processing of substrates.

After block 110, the substrate may then be subjected to downstream processing, such as thermal annealing, thermal cleaning, thermal chemical vapor deposition, thermal oxidation or thermal nitridation, which may be performed in a temperature controlled processing chamber such as one shown in FIG. 6. Alternatively, one or more steps of the method 100 may be repeated until a predetermined thickness (e.g., 5-10 nm) of Si:P epitaxial film has been formed on the target surfaces of the substrate. For example, if the contact trenches on the substrate has a high aspect ratio (10:1 or higher), blocks 104, 106, 108 and 110 may be repeated for 2 to 5 cycles to maximize etching of unwanted films from the dielectric surfaces at or near the bottom trench.

It should be noted that the concept described in implementations of the present disclosure is also applicable to epitaxy process for forming other materials. Some possible examples may include undoped silicon, SiGe/SiGe:B, Si:CP, pure Ge, GeSn, GeP, GeB, or GeSnB, etc., which may be used in logic and memory applications. In such cases, possible silicon precursors or dopant gases may be the same as those described above, and possible germanium precursors may include, but are not limited to $GeH_4$, $Ge_2H_6$, or halogenated germanium such as $GeCl_4$, $GeHCl_3$, $Ge_2Cl_6$, $Ge_3Cl_8$, etc.

FIG. 2 is a cross-sectional view of a processing chamber 200 that may be used to perform the cleaning process found in block 102. The processing chamber 200 may be particularly useful for performing a thermal or plasma-based oxidation process and/or a plasma assisted dry etch process. The processing chamber 200 includes a chamber body 212, a lid assembly 214, and a support assembly 216. The lid assembly 214 is disposed at an upper end of the chamber body 212, and the support assembly 216 is at least partially disposed within the chamber body 212. A vacuum system can be used to remove gases from processing chamber 200. The vacuum system includes a vacuum pump 218 coupled to a vacuum port 221 disposed in the chamber body 212. The processing chamber 200 also includes a controller 202 for controlling processes within the processing chamber 200.

The lid assembly 214 includes at least two stacked components configured to form a plasma volume or cavity there between. A first electrode 220 is disposed vertically above a second electrode 222 confining a plasma volume therebetween. The first electrode 220 is connected to a power source 224, such as a radio frequency (RF) power supply, and the second electrode 222 is connected to ground or a source return, forming a capacitance between the first electrode 220 and the second electrode 222. The lid assembly 214 also includes one or more gas inlets 226 for providing a cleaning gas to a substrate surface through a blocker plate 228 and a gas distribution plate 230, such as a showerhead. The cleaning gas may be an etchant or ionized active radical, such as ionized fluorine, chlorine, or ammonia, or an oxidizing agent, such as ozone.

Alternatively, a different cleaning process may be utilized to clean the substrate surface. For example, a remote plasma containing He and $NF_3$ may be introduced into the processing chamber 200 through the gas distribution plate 230, while $NH_3$ may be directly injected into the processing chamber 200 via a separate gas inlet 225 that is disposed at a side of the chamber body 212.

The support assembly 216 may include a substrate support 232 to support a substrate 210 thereon during processing. The substrate support 232 has a flat substrate supporting surface for supporting the substrate to be processed thereon. The substrate support 232 may be coupled to an actuator 234 by a shaft 236 which extends through a centrally-located opening formed in a bottom of the chamber body 212. The actuator 234 may be flexibly sealed to the chamber body 212 by bellows (not shown) that prevent vacuum leakage from around the shaft 236. The actuator 234 allows the substrate support 232 to be moved vertically within the chamber body 212 between a process position and a lower, transfer position. The transfer position is slightly below the opening of a slit valve formed in a sidewall of the chamber body 212. In operation, the substrate support 232 may be elevated to a position in close proximity to the lid assembly 214 to control the temperature of the substrate 210 being processed. As such, the substrate 210 may be heated via radiation emitted or convection from the distribution plate 230.

A bias RF power supply 280 may be coupled to the substrate support 232 via a cable 282 through a matching network 284. The bias RF power supply 280 provides a bias to the substrate 210 to direct the ionized cleaning gas toward the substrate 210.

FIG. 3 is a cross-sectional view of a plasma-cleaning chamber 300 that may be used to perform the cleaning process found in block 102. The processing chamber 300 has a chamber body 310 that includes a chamber adapter 316, an adapter 318 and a lid 340. The chamber adapter 316 and the lid 340 may be fabricated from aluminum, stainless steel or other suitable materials. The lid 340 is removably coupled to the chamber adapter 316 to define a process region 330 therein.

A heater (or pedestal) 314 is disposed in the process region 330 of the chamber body 310. The heater 314 is coupled to a bottom of the chamber adapter 316 through a central shaft. The heater 314 has a substrate supporting surface for supporting the substrate 308 thereon during a process, such as cleaning of the surface of the substrate described above with respect to box 104. The heater 314 may be fabricated from bare aluminum with sapphire contact. The heater 314 is actuated to move vertically between a loading position and a processing position. The heater 314 may be utilized to provide temperature to the substrate 308, thereby heating or cooling the substrate during process. In some implementations, the heater 314 may use a ring-like substrate support (not shown) to support and lift up the substrate 308 from the edge of the substrate when the heater 314 is lowered down to the loading position. During the process, the heater 314 is raised up to the processing position, which picks up and supports the substrate 308 with its substrate supporting surface at a desired height for processing of the substrate 308.

In some implementations, the heater 314 may support an optional focus ring 338 disposed on its outer periphery. The focus ring 338 circumscribes the substrate 308 during processing. In one example, the focus ring 338 is fabricated from quartz.

The adapter 318 is disposed between the lid 340 and the chamber adapter 316 and supports a gas distribution plate 326 thereon. The gas distribution plate 326 may be a quartz showerhead. A plenum 348 is defined between the gas distribution plate 326 and the lid 340. The gas distribution plate 326 includes a plurality of apertures 327 to allow gases flowing into the plenum 348 through a port 342 formed in the lid 340 to be distributed across the substrate 308 disposed in the process region 330.

An opening 315 is formed at the bottom of the chamber adapter 316 and is connected to a pump 317. The pump 317 may be used to control the pressure inside the chamber body 310 from between about 1 mTorr and about 500 Torr. For example, the pump 317 may be a low pressure pump that maintains the pressure inside the chamber body 310 at an exemplary pressure range of about 10 mTorr to about 500 mTorr. The pump 317 may also be a turbo pump that maintains the pressure inside the chamber body 310 at an exemplary pressure range of about 20 Torr to 300 Torr.

A remote plasma source 350 is coupled to the port 342 by a passage 360. The passage 360 defines a conduit 356 through which the reactive radicals generated in the remote plasma source 350 are filtered before entering the process region 330. The reactive radicals generated therefrom may include ions, charged species, and other reactive species. In one implementation, the gases flowing through the conduit 356 are filtered by a magnetic field generated by one or more magnets disposed adjacent to the passage 360. The magnets generate a magnetic field across the passage 360 to filter charged particles entrained with the reactive radicals flowing from the remote plasma source 350.

In the implementation depicted in FIG. 3, a first magnet 352 and a second magnet 354 are disposed adjacent the passage 360. The magnets 352, 354 may be disposed to oppose to each other across the passage 360. For example, the magnets 352, 354 may be adhered or secured on opposite sides of an outer periphery of the passage 360. It is also contemplated that the magnets 352, 354 may be secured to the chamber lid 340 or other components of the chamber body 310. The relative distance between the opposed magnet and the conduit 356 formed within the passage 360 affects the strength of the magnetic field passing through the conduit 356, and thereby affects the filtering efficiency. The magnetic field may also be adjusted by using different magnets, i.e., replacing magnets 352, 354 with different strength. The passing charged particles are drawn in contact with an inner surface 370 of the passage 360 and become electrically neutral, non-ionic species. As such, the filtered, electrically neutral radicals are delivered to the surface of the substrate to react with and clean oxides and/or contaminants thereon.

In some implementations, the reactive radicals may be further filtered by providing a quartz surface in the flow path of the process gases (i.e., reactive radicals) passing into the chamber body 310. For example, the inner surface 370 of the passage 360 defining the conduit 356 connecting the remote plasma source 350 and the chamber body 310 may be entirely or partially coated or fabricated from quartz. Additionally, the surfaces defining the plenum 348 and/or gas distribution plate 326 may also be entirely or at least partially coated or fabricated from quartz. For example, in the implementation of FIG. 3, a quartz ring 324 may circumscribe the outer boundary of the plenum 348. Additionally, a quartz liner 344 may be disposed on the bottom surface of the lid 340 defining the upper boundary of the plenum 348.

The inner surface 370 of the passage 360 serves as an ion filter to reduce the recombination of the radicals by providing a quartz surface with which hydrogen-containing radicals can hydrogen bond and absorb onto the quartz surface. Hydrogen-containing radicals that impinge on the inner surface 370 release an absorbed hydrogen-containing radical into the energized gas, thereby regenerating hydrogen radicals. The hydrogen ions are not regenerated by the inner surface 370, and thus these ions recombine to form electrically neutral, non-ionic species. Thus, by passing the activated cleaning gas over the quartz surface, the reactive radicals are effectively filtered from the energized cleaning gas, while the radical species are preserved. The charged particles from recombined active radical are efficiently reduced.

Figure 4:
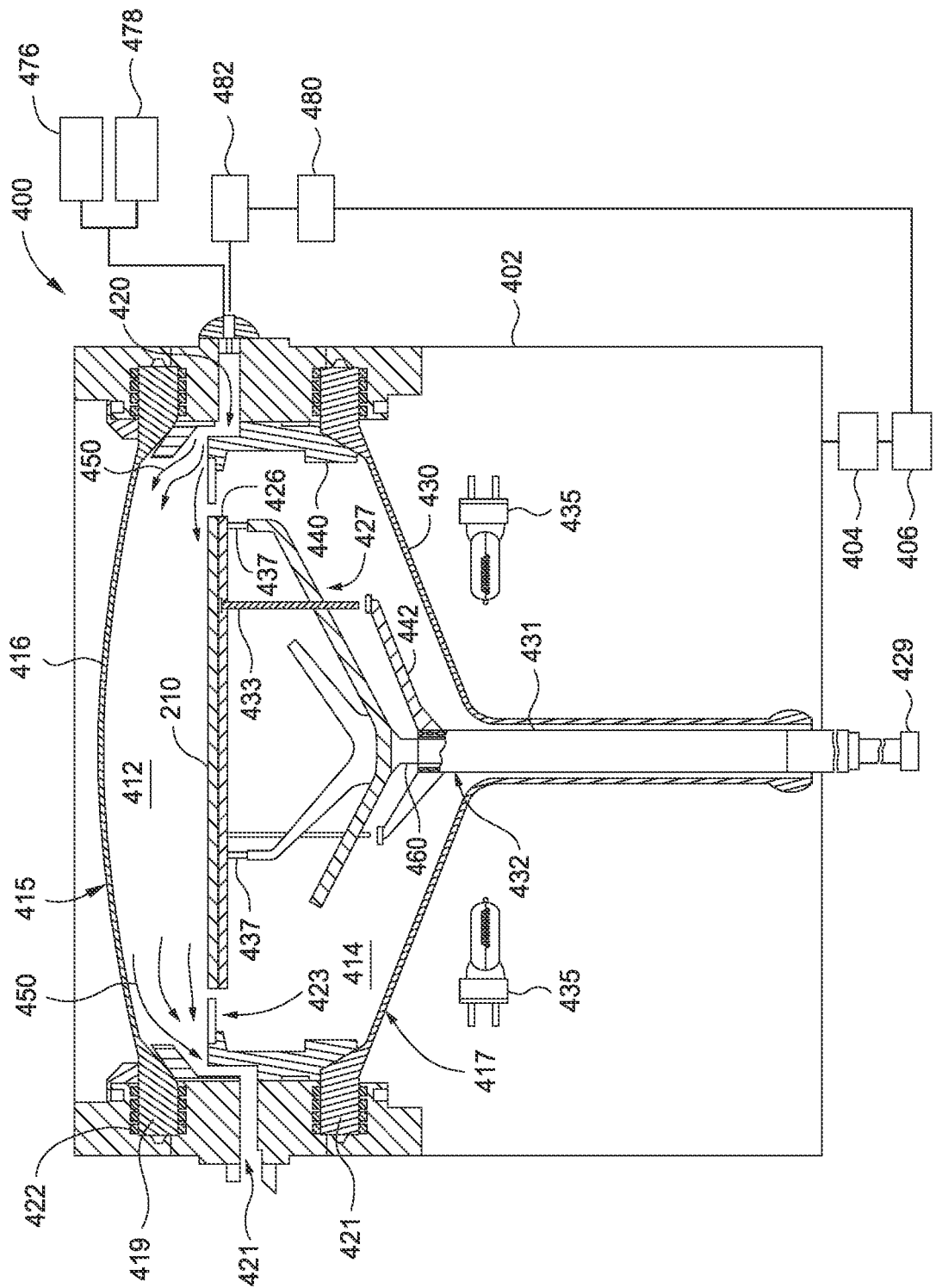
FIG. 4 is a cross-sectional view of a thermal processing chamber that may be used to perform an epitaxial process found in FIG. 1.

FIG. 4 is a cross-sectional view of a thermal processing chamber 400 that may be used to perform the epitaxial process found in block 104. The processing chamber 400 includes a chamber body 402, support systems 404, and a controller 406. The chamber body 402 includes an upper portion 412 and a lower portion 414. The upper portion 412 includes the area within the chamber body 402 between the upper dome 416 and a substrate 210. The lower portion 414 includes the area within the chamber body 402 between a lower dome 430 and the bottom of the substrate 210. Deposition processes generally occur on the upper surface of the substrate 210 within the upper portion 412.

The support system 404 includes components used to execute and monitor pre-determined processes, such as the growth of epitaxial films in the processing chamber 400 as discussed above in block 104. A controller 406 is coupled to the support system 404 and is adapted to control the processing chamber 400 and support system 404. The controller 406 includes a central processing unit (CPU), a memory, and support circuits.

The processing chamber 400 includes a plurality of heat sources, such as lamps 435, which are adapted to provide thermal energy to components positioned within the process chamber 400. For example, the lamps 435 may be adapted to provide thermal energy to the substrate 210, a susceptor 426, and/or the preheat ring 423. The lower dome 430 may be formed from an optically transparent material, such as quartz, to facilitate the passage of thermal radiation therethrough. It is contemplated that lamps 435 may be positioned to provide thermal energy through the upper dome 416 as well as the lower dome 430.

The chamber body 402 includes a plurality of plenums formed therein. The plenums are in fluid communication with one or more gas sources 476, such as a carrier gas, and one or more precursor sources 478, such as deposition gases and dopant gas discussed above in block 104. For example, a first plenum 420 may be adapted to provide a deposition gas 450 therethrough into the upper portion 412 of the chamber body 402, while a second plenum 421 may be adapted to exhaust the deposition gas 450 from the upper portion 412. In such a manner, the deposition gas 450 may flow parallel to an upper surface of the substrate 210.

In cases where a liquid precursor (e.g., tetrasilane) is used, the thermal processing chamber 400 may include a liquid vaporizer 480 in fluid communication with a liquid precursor source 482. The liquid vaporizer 480 is be used for vaporizing liquid precursors to be delivered to the thermal processing chamber 400. While not shown, it is contemplated that the liquid precursor source 482 may include, for example, one or more ampules of precursor liquid and solvent liquid, a shut-off valve, and a liquid flow meter (LFM).

A substrate support assembly 432 is positioned in the lower portion 414 of the chamber body 402. The substrate support 432 is illustrated supporting a substrate 210 in a processing position. The substrate support assembly 432 includes a susceptor support shaft 427 formed from an optically transparent material and the susceptor 426 supported by the susceptor support shaft 427. A shaft 460 of the susceptor support shaft 427 is positioned within a shroud 431 to which lift pin contacts 442 are coupled. The susceptor support shaft 427 is rotatable in order to facilitate the rotation of the substrate 210 during processing. Rotation of the susceptor support shaft 427 is facilitated by an actuator 429 coupled to the susceptor support shaft 427. The shroud 431 is generally fixed in position, and therefore, does not rotate during processing. Support pins 437 couple the susceptor support shaft 427 to the susceptor 426.

Lift pins 433 are disposed through openings (not labeled) formed in the susceptor support shaft 427. The lift pins 433 are vertically actuatable and are adapted to contact the underside of the substrate 210 to lift the substrate 210 from a processing position (as shown) to a substrate removal position.

The preheat ring 423 is removably disposed on a lower liner 440 that is coupled to the chamber body 402. The preheat ring 423 is disposed around the internal volume of the chamber body 402 and circumscribes the substrate 210 while the substrate 210 is in a processing position. The preheat ring 423 facilitates preheating of a process gas as the process gas enters the chamber body 402 through the plenum 420 adjacent to the preheat ring 423.

The central window portion 415 of the upper dome 416 and the bottom portion 417 of the lower dome 430 may be formed from an optically transparent material such as quartz. The peripheral flange 419 of the upper dome 416, which engages the central window portion 415 around a circumference of the central window portion 415, the peripheral flange 421 of the lower dome 430, which engages the bottom portion around a circumference of the bottom portion, may all be formed from an opaque quartz to protect the O-rings 422 proximity to the peripheral flanges from being directly exposed to the heat radiation. The peripheral flange 419 may be formed of an optically transparent material such as quartz.

FIG. 5 is a cross-sectional view of an ICP plasma chamber 500 that may be used to perform any of the processes found in blocks 102, 106, 108 and 110. The plasma chamber 500 depicted in FIG. 5 includes an upper portion 528 and a lower portion 530. The plasma chamber 500 has a sidewall 505 and a lid assembly 510. The sidewall 505 has an axially symmetrical shape, such as a cylinder. The sidewall 505 includes an axially symmetrical (e.g., cylindrical) dielectric side window 506 and a chamber liner 507, which may be formed of metal. A substrate support 515 inside the plasma chamber 500 includes a pedestal 520 having a substrate support surface 521 facing the lid assembly 510 for holding a substrate 210, and a post 525 supporting the pedestal 520. A processing region 501 of the plasma chamber 500 is confined by the lid assembly 510, the pedestal 520 and the sidewall 505.

The pedestal 520 may include an insulated internal electrode 524. Optionally, an electrostatic chucking (ESC) voltage and/or RF plasma bias power may be supplied to the insulated internal electrode 524 via a cable 532 extending through the post 525. The cable 532 may be coupled to an RF bias power source (such as an RF impedance matching network and/or an RF power generator) as an RF bias feed to the insulated internal electrode 524.

The plasma source power is inductively coupled into the processing region 501 by a set of coil antennas, including an inner coil antenna 540, a middle coil antenna 550 and optionally an outer or side coil antenna 560, all of which are concentrically disposed with respect to each other and are coaxial with the axis of symmetry of the sidewall 505. The lid assembly 510 includes a disk-shaped dielectric window 512 through which the inner coil antenna 540 and the middle coil antenna 550 inductively couple RF plasma source power into the processing region 501. The disk-shaped dielectric window 512 is supported at its periphery by an annular top gas plate 523. The annular top gas plate 523 surrounds an opening 504. The disk-shaped dielectric window 512 is coaxial with the sidewall 505 and has a disk-plane parallel with the plane of the substrate support surface 521. The side coil antenna 560 inductively couples RF plasma source power into the processing region 501 through the cylindrical dielectric side window 506.

A gas injector 514 is located at the center of the disk-shaped dielectric window 512 and surrounded by an annular gas flow plate 516. The gas flow plate 516 may have a plurality of gas input ports (not shown) configured to provide gas flow path to the gas injector 514. Cleaning gas or etching gas is injected into the processing region 501 by the gas injector 514.

The chamber liner 507 is enclosed within a lower chamber body 570 including a cylindrical lower chamber body sidewall 575 and a lower chamber body floor 580. The lower chamber body sidewall 575 and the lower chamber body floor 580 enclose an evacuation region 581. A vacuum pump 590 is disposed in a vacuum pump opening 595 in the lower chamber body floor 580 and is centered relative to the axis of symmetry of the lower chamber body sidewall 575. A containment wall 596 coaxial with the substrate support 515 and a flexible bellows 597 extending between the pedestal 520 and the containment wall 596 enclose the substrate support 515 in an internal central space 598. The internal central space 598 is isolated from the volume evacuated by the vacuum pump 590, including the evacuation region 581 and the processing region 501.

The power may be supplied from a common RF source or from different RF sources such as RF matches (RF impedance matching networks) 542 and 544. An RF impedance matching network may be employed having dual outputs in order to drive two of the coil antennas with a first RF generator, while a second RF generator and a second RF impedance matching network drives the third coil antenna. In one implementation, a single RF power generator may drive all three-coil antennas through an RF impedance matching network having three outputs. Alternatively, three RF generators may separately drive the three coil antennas through three respective RF impedance matching networks. The RF power level applied to the different coil antennas may be separately adjusted in order to control radial distribution of plasma ion density. While described implementations include the three coil antennas 540, 550 and 560, other implementations may include only one or two of the three described coil antennas 540, 550 and 560.

FIG. 6 is a schematic, cross-sectional view of a processing system 600 that may be used for temperature-controlled processing of substrates, such as silicon substrates. The processing system 600 includes a processing unit 624 and a first heat unit 608. The processing unit 624 may be a VANTAGE® RADOX™ RTP chamber, available from Applied Materials, Inc., Santa Clara, CA. The processing unit 624 is capable of providing a controlled thermal cycle that heats a substrate 201 for processes such as, for example, thermal annealing, thermal cleaning, thermal chemical vapor deposition, thermal oxidation or thermal nitridation.

The processing unit 624 includes a chamber 636 enclosing a process zone 602. The chamber 636 may be made of stainless steel, aluminum or other suitable materials. The chamber 636 may also include a gas outlet 618 and a first gas inlet 616 opposing the gas outlet 618. The chamber 636 may include a substrate support 642 disposed therein for supporting the substrate 201 thereupon during processing in the process zone 602. The substrate support 642 may include a magnetically levitated rotor 620 and a quartz support cylinder 622 that rotates the substrate 201 during processing. A radiation source 646 directs radiation onto the substrate 201, and may be positioned below the substrate 201 adjacent a bottom surface 638 of the chamber 636 below a radiation permeable window 644. In one implementation, the radiation source 646 may include a plurality of heat elements 606. The plurality of heat elements 606 may include one or more approximately radial heating zones that can be independently modulated to control temperatures across the substrate 201.

In one implementation, the heat elements 606 may be a plurality of tungsten-halogen lamps for providing a tailored infrared heating means to the substrate 201. The radiation source 646 is capable of rapidly heating the substrate 201 for thermal processing, for example at a rate of from about 50° C./s to about 280° C./s. Temperature tuning may be performed to change the temperature of the substrate 201 at certain locations while not affecting the rest of the substrate temperature. In another implementation, the radiation source 646 may be located within the chamber 636.

The first heat unit 608 may be coupled to a first conduit 612. The first conduit 612 may be coupled to a first gas source 628 and provide a connection between the first gas source 628 and the first gas inlet 616. Thus, the first heat unit 608 may be operably coupled to the processing unit 624. The first heat unit 608 may heat a first gas to a first temperature before entering the process zone 602 in the chamber 636. The gas sources may provide process gases into the process zone 602. In cases where a reaction using $H_2O_2$, the second process gas may be hydrogen. In cases where a reaction involving $N_2O$, the second process gas may be nitrogen. The first conduit 612 may be insulated by insulator 634 in the portion 614 that extends between the first heat unit 608 and the first gas inlet 616. Insulating the first conduit 612 advantageously decreases heat loss as the first gas flows from the first heat unit 608 to the process zone 602. Heating the first gas prior to entering the process zone 602 advantageously improves uniformity by decreasing the temperature gradient across the surface of the substrate 201. Additionally, because the second gas is added to the first gas after the first gas has been heated, the two gases may react near the process zone 602. In one implementation, the first gas is the gas that has a lower thermal conductivity and thus controls the combustion reaction. In cases where a reaction using $H_2O_2$, the first gas may be oxygen. In cases where a reaction involving $N_2O$, the first gas may be oxygen.

A coupling unit 648 may couple the portion 614 of the first conduit 612 with the chamber 636. In one implementation, the coupling unit 648 may be silica. While the temperature of the substrate 201 may reach about 1000° C., the walls of the chamber 636 are maintained close to about 30° C. to maintain the integrity of the seals of the chamber 636. As such, the coupling unit 648 advantageously maintains the integrity of the chamber 636 during processing of the substrate 201.

Figure 7:
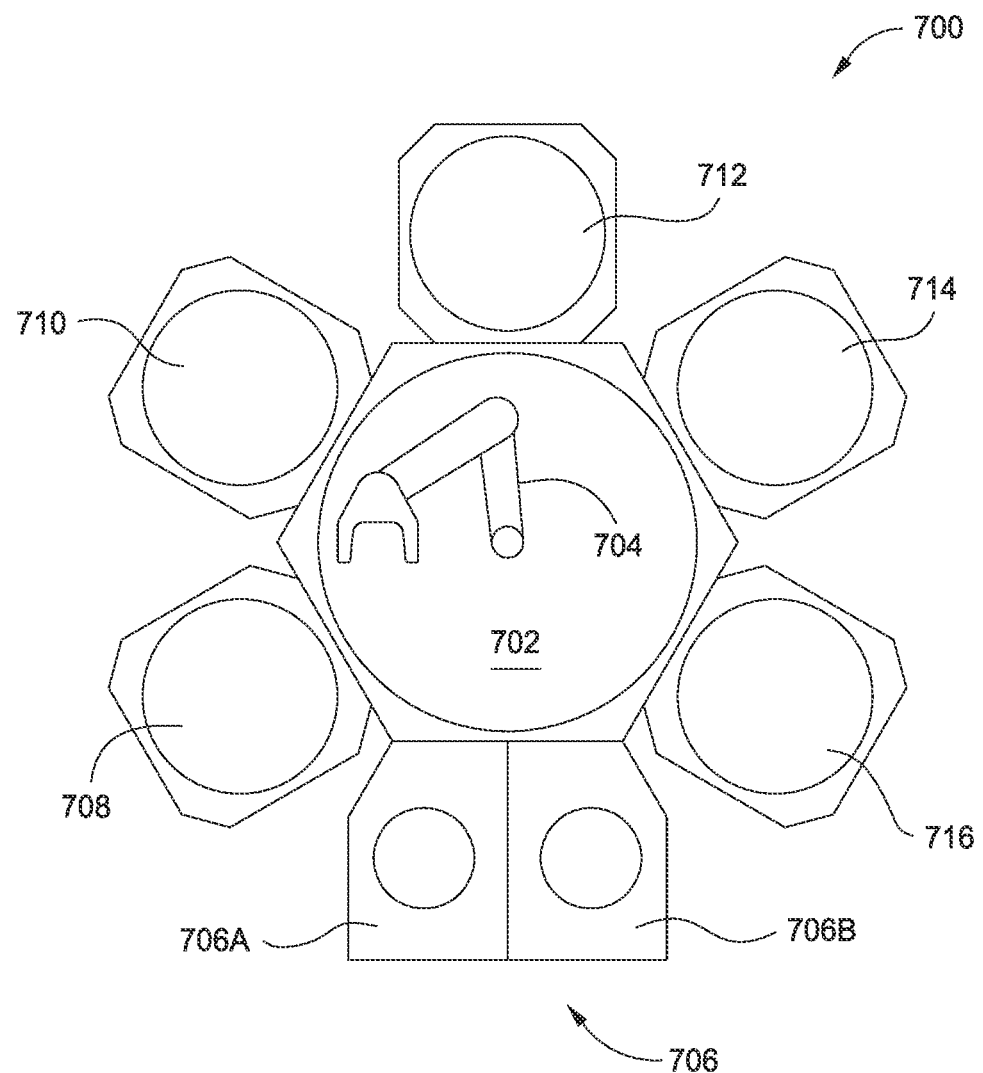
FIG. 7 is a schematic top view of a processing system that can be used to complete the flow chart of FIG. 1.

FIG. 7 is a schematic top view of a processing system 700 that can be used to complete the flow chart 100 illustrated in FIG. 1 according to implementations described herein. One example of the processing system 700 is the CENTURA® system, available from Applied Materials, Inc., of Santa Clara, California. A transfer robot 704 of any convenient type is disposed in a transfer chamber 702 of the processing system 700. A load-lock 706, with two load-lock chambers 706A, 706B is coupled to the transfer chamber 702. A plurality of processing chambers 708, 710, 712, 714, and 716 are also coupled to the transfer chamber 702. The plurality of processing chamber 708, 710, 712, 714, and 716 may include at least one of the chambers described above with respect to FIGS. 2 to 6, such as a cleaning chamber, an etching chamber, an epitaxial chamber, or an oxidization chamber, etc.

Processing chamber 708 may be a cleaning chamber configured to clean a substrate prior to deposition. For example, the processing chamber 708 may be a capacitively coupled processing chamber similar to the processing chamber 200 depicted in FIG. 2. In one implementation, the processing chamber 708 is a SICONI™ Preclean chamber, available from Applied Materials, Inc. of Santa Clara, California. The processing chamber 708 may be used to perform the cleaning process as discussed above in block 102.

Processing chamber 710 may also be a cleaning chamber configured to clean a substrate prior to deposition. For example, the processing chamber 710 may be a pre-clean chamber using remote plasma source similar to the plasma-cleaning chamber 300 depicted in FIG. 3. In one implementation, the processing chamber 710 is an AKTIV® Pre-Clean chamber, available from Applied Materials, Inc. of Santa Clara, California. The processing chamber 710 uses electrically neutral radicals (e.g., hydrogen radicals) to react with and clean oxides and/or contaminants on a substrate as discussed above in block 102 and/or block 108.

Processing chamber 712 may be a thermal processing chamber configured to deposit material on a substrate. For example, the processing chamber 712 may be a material deposition chamber such as an epitaxy chamber similar to the processing chamber 400 depicted in FIG. 4. In one implementation, the processing chamber 712 is a Centura® RP EPI chamber available from Applied Materials, Inc. of Santa Clara, California. The processing chamber 712 may be used to perform an epitaxial growth process as discussed above in block 104 and a purge process as discussed above in block 106.

Processing chamber 714 may be an etching chamber configured to etch material from a substrate. For example, the processing chamber 714 may be a plasma chamber such as an ICP plasma chamber similar to the plasma chamber 500 depicted in FIG. 5. In one implementation, the processing chamber 714 is a Centura® Advantedge™ Mesa™ etch chamber, available from Applied Materials, Inc. of Santa Clara, California. The processing chamber 714 may be used to perform etch-related process as discussed above in block 108.

Processing chamber 716 may be a thermal process chamber configured to provide a controlled thermal cycle that heats a substrate. For example, the processing chamber 716 may be a thermal process chamber similar to the processing system 600 depicted in FIG. 6. In one implementation, the processing chamber 716 is a VANTAGE© RADOX™ RTP chamber, available from Applied Materials, Inc., Santa Clara, CA. The processing chamber 716 may be used to perform downstream processing after deposition, such as thermal annealing, thermal cleaning, thermal chemical vapor deposition, thermal oxidation or thermal nitridation as discussed above in block 110. In one example, the thermal process chamber 716 contains a radiation source having a plurality of heat elements.

During processing, a substrate that is to be processed may arrive to the processing system 700 in a pod (not shown). The substrate is transferred from the pod to the vacuum compatible load-lock 706A, 706B by the factory interface robot (not shown). The substrate is then handled by the transfer robot 704 in the transfer chamber 702, which is generally kept in a vacuum state. The transfer robot 704 then loads the substrate into either processing chamber 708 or processing chamber 710 for cleaning of the substrate, as described in block 102. Upon completion of the cleaning, the transfer robot 704 then picks up the substrate from the processing chamber 708 or 710 and loads the substrate into the processing chamber 712 for epitaxial growth of material on the substrate and chamber purging, as described in blocks 104 and 106. The transfer robot 704 then picks up the substrate from the processing chamber 712 and loads the substrate into the processing chamber 714 for etching materials from the substrate, as described in block 108. This sequence is repeated until a predetermined thickness of the epitaxial film is reached. Thereafter, the transfer robot 704 picks up the substrate from the processing chamber 714 and load it into the processing chamber 716 for any downstream processing, such as thermal annealing, thermal cleaning, thermal chemical vapor deposition, thermal oxidation or thermal nitridation, as discussed above in block 110. Because all operations (blocks 102, 104, 106, 108, and 110) are performed within the same processing system, the substrate is not exposed to atmosphere (i.e., vacuum is not broken) as the substrate is transferred to various processing chambers, which decreases the chance of contamination and improves the quality of the deposited epitaxial film.

The transfer chamber 702 may remain under vacuum and/or at a pressure below atmosphere during the process. The vacuum level of the transfer chamber 702 may be adjusted to match the vacuum level of corresponding processing chambers. For example, when transferring a substrate from a transfer chamber 702 into a processing chamber (or vice versa), the transfer chamber 702 and the processing chamber may be maintained at the same vacuum level. Then, when transferring a substrate from the transfer chamber to the load lock chamber or batch load lock chamber (or vice versa), the transfer chamber vacuum level may match the vacuum level of the load-lock chamber 706A, 706B even through the vacuum level of the load-lock chamber and the processing chamber may be different.

In summary, benefits of the present disclosure provide an integrated system and method for pre-cleaning a silicon-containing substrate prior to epitaxial deposition and a cyclic deposition-etch process including an epitaxial deposition step using disilane or tetrasilane (or higher order silanes) and an etch-back step using GeH$_4$ and HCl, which results in an improved device quality and etch selectivity (at least 50:1) of an epitaxy process. The etch-back step using GeH$_4$ and HCl allows for effective removal of possible silicon nuclei from dielectric surfaces and formation of a silicon epitaxial film with much lower loss of active dopant at reduced etch temperatures (below 500° C.). With the inventive deposition-etch process, a phosphorous-containing silicon layer having a phosphorus concentration of 5.77×10$^{20}$ atoms per cubic centimeter or greater, for example 9.49×10$^{20}$ atoms per cubic centimeter, can be achieved without sacrificing the throughput. The high phosphorus concentration induces stress within the deposited epitaxial film, thereby increasing tensile strain, leading to increased carrier mobility and improved device performance. In addition, clustering process chambers through vacuum transfer reduces exposure to atmosphere and correspondingly reduces exposure to oxygen contaminants. Clustering the native oxide removal chambers along with the etching of silicon and epitaxial deposition also leads to a reduction in oxygen contaminants. Thus, the integrated system advantageously provides for an improved semiconductor device.

While the foregoing is directed to implementations of the present disclosure, other and further implementations of the disclosure may be devised without departing from the basic scope thereof

The invention claimed is:

1. A method of forming an epitaxial layer, comprising:
   removing oxides from a surface of a substrate within a processing system during a cleaning process; then
   flowing a processing reagent comprising a silicon source into the processing system and exposing the substrate to the processing reagent during an epitaxy process;
   stopping the flow of the processing reagent into the processing system; then
   flowing a purging gas into the processing system and pumping residues from the processing system;
   stopping the flow of the purge gas; then
   flowing an etching gas into the processing system and exposing the substrate to the etching gas, wherein the etching gas comprises hydrogen chloride and at least one compound selected from a germanium-containing compound, a chlorine-containing compound, or a mixture thereof;
   stopping the flow of the at least one compound while continuing the flow of the hydrogen chloride and exposing the substrate to the hydrogen chloride; and
   stopping the flow of the hydrogen chloride.

2. The method of claim 1, wherein the silicon source comprises disilane, trisilane, tetrasilane, pentasilane, or hexasilane.

3. The method of claim 1, wherein the cleaning process comprises a sputter etch process, a plasma-based oxide etch process, a wet etch process, a bake process, or combinations thereof.

4. The method of claim 1, wherein the cleaning process comprises the plasma-based oxide etch processes, which further comprises simultaneously exposing the substrate to NF$_3$ and NH$_3$ plasma by-products formed by a inductively coupled plasma process, a capacitively coupled plasma process, or a remote plasma assisted dry etch process.

5. The method of claim 1, wherein the cleaning process comprises heating the substrate in the presence of hydrogen gas.

6. The method of claim 1, wherein the cleaning process further comprises forming silicon-hydrogen bonds on the surface of the substrate subsequent to the removing the oxides.

7. The method of claim 1, wherein the cleaning process is performed a pre-clean chamber comprising a capacitively coupled plasma source and a substrate support coupling to a bias RF power supply, and wherein the capacitively coupled plasma source is coupled to sources of He and NF$_3$.

8. The method of claim 1, wherein the cleaning process comprises exposing the oxides on the surface of the substrate to an HF clean to produce —H terminations on monocrystalline silicon surfaces and —OH terminations on dielectric oxide surfaces.

9. The method of claim 1, wherein the purging gas comprises hydrogen or argon.

10. The method of claim 1, wherein the etching gas comprises the germanium-containing compound, and wherein the germanium-containing compound comprises germanium hydride, digermane, trigermane, germanium tetrachloride, dichlorogermane, trichlorogermane, hexachlorodigermane, or any combination thereof.

11. The method of claim 1, wherein the etching gas comprises the chlorine-containing compound, and wherein the chlorine-containing compound comprises chlorine, boron trichloride, phosphorus trichloride, or any combinations thereof.

12. The method of claim 1, wherein the etching gas comprises hydrogen chloride, germanium hydride, and phosphorus trichloride.

13. The method of claim 1, wherein the etching gas further comprises a carrier gas comprising hydrogen, nitrogen, argon, helium, and any combinations thereof.

14. The method of claim 1, wherein the etching gas selectively removes an amorphous silicon from dielectric surfaces on the substrate.

15. The method of claim 1, wherein the surface of the substrate comprises contact trenches having an aspect ratio of 10:1 or greater.

16. The method of claim 1, wherein the epitaxy process is performed in an epitaxy chamber coupled to processing system, and the epitaxy chamber comprises a liquid precursor vaporizer in fluid communication with a liquid precursor source.

17. A method of forming an epitaxial layer, comprising:
removing oxides from a surface of a substrate within a processing system during a cleaning process; then
performing a process cycle which comprises:
flowing a processing reagent comprising a silicon source into the processing system and exposing the substrate to the processing reagent during an epitaxy process;
stopping the flow of the processing reagent into the processing system; then
flowing a purging gas into the processing system and pumping residues from the processing system;
stopping the flow of the purge gas; then
flowing an etching gas into the processing system and exposing the substrate to the etching gas, wherein the etching gas comprises hydrogen chloride and at least one compound selected from a germanium-containing compound, a chlorine-containing compound, or a mixture thereof;
stopping the flow of the at least one compound while continuing the flow of the hydrogen chloride and exposing the substrate to the hydrogen chloride; and
stopping the flow of the hydrogen chloride; and
repeating the process cycle.

18. The method of claim 17, wherein the silicon source comprises disilane, trisilane, tetrasilane, pentasilane, or hexasilane.

19. The method of claim 17, wherein the process cycle is repeated for 2 cycles to 5 cycles.

20. The method of claim 19, wherein the surface of the substrate comprises contact trenches having an aspect ratio of 10:1 or greater.

21. The method of claim 17, wherein the cleaning process comprises the plasma-based oxide etch processes, which further comprises simultaneously exposing the substrate to $NF_3$ and $NH_3$ plasma by-products formed by a inductively coupled plasma process, a capacitively coupled plasma process, or a remote plasma assisted dry etch process.

22. A method of forming an epitaxial layer, comprising:
removing oxides from a surface of a substrate within a processing system during a cleaning process, wherein the surface of the substrate comprises contact trenches having an aspect ratio of 10:1 or greater, and wherein the cleaning process comprises the plasma-based oxide etch processes, which further comprises simultaneously exposing the substrate to $NF_3$ and $NH_3$ plasma by-products formed by a inductively coupled plasma process, a capacitively coupled plasma process, or a remote plasma assisted dry etch process; then
flowing a processing reagent comprising disilane or tetrasilane into the processing system and exposing the substrate to the processing reagent during an epitaxy process;
stopping the flow of the processing reagent into the processing system; then
flowing a purging gas into the processing system and pumping residues from the processing system;
stopping the flow of the purge gas; then
flowing an etching gas into the processing system and exposing the substrate to the etching gas, wherein the etching gas comprises hydrogen chloride and at least one compound selected from a germanium-containing compound, a chlorine-containing compound, or a mixture thereof;
stopping the flow of the at least one compound while continuing the flow of the hydrogen chloride and exposing the substrate to the hydrogen chloride;
stopping the flow of the hydrogen chloride; and then
exposing the substrate to a thermal annealing process within the processing system.

* * * * *